(12) United States Patent
Yang et al.

(10) Patent No.: US 10,429,626 B2
(45) Date of Patent: Oct. 1, 2019

(54) METHOD FOR DESIGING OFF-AXIAL THREE-MIRROR OPTICAL SYSTEM WITH FREEFORM SURFACES

(71) Applicants: Tsinghua University, Beijing (CN); HON HAI PRECISION INDUSTRY CO., LTD., New Taipei (TW)

(72) Inventors: Tong Yang, Beijing (CN); Jun Zhu, Beijing (CN); Guo-Fan Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 1274 days.

(21) Appl. No.: 14/616,463

(22) Filed: Feb. 6, 2015

(65) Prior Publication Data

US 2015/0253554 A1    Sep. 10, 2015

(30) Foreign Application Priority Data

Mar. 5, 2014  (CN) .......................... 2014 1 0077992

(51) Int. Cl.
*G02B 17/06* (2006.01)
*G02B 27/00* (2006.01)
*G06F 17/50* (2006.01)

(52) U.S. Cl.
CPC ..... *G02B 17/0642* (2013.01); *G02B 27/0012* (2013.01); *G06F 17/50* (2013.01); *G06F 17/5086* (2013.01)

(58) Field of Classification Search
CPC . G02B 17/0642; G02B 27/0012; G06F 15/50; G06F 17/50

(Continued)

(56) References Cited

U.S. PATENT DOCUMENTS 8,975,571 B2 * 3/2015 Hou ................... G02B 17/0621
250/208.1
9,250,428 B2 * 2/2016 Zhu ..................... G02B 17/0642

(Continued)

OTHER PUBLICATIONS

"Design of freeform imaging systems with linear field-of-view using a construction and iteration process",Tong Yang etc, Optics Express, Feb. 5, 2014, 3362-3374, vol. 22, No. 3.

(Continued)

*Primary Examiner* — Ricky D Shafer
(74) *Attorney, Agent, or Firm* — ScienBiziP, P.C.

(57) ABSTRACT

A method for designing off-axial three-mirror optical system with freeform surfaces is provided. A first initial surface, a second initial surface, and a third initial surface are established. A plurality of feature rays are selected, while the first initial surface and the third initial surface remain unchanged; a plurality of first feature data points are calculated to obtain a third freeform surface equation by surface fitting the plurality of first feature data points. A third freeform surface and the second initial surface are remained unchanged; a plurality of second feature data points are calculated to obtain a first freeform surface equation by surface fitting the plurality of second feature data points. The third freeform surface and a first freeform surface are remained unchanged; a plurality of third feature data points are calculated to obtain a second freeform surface equation by surface fitting the plurality of third feature data points.

13 Claims, 9 Drawing Sheets

(58) Field of Classification Search
USPC ........ 359/365, 727, 730, 857, 858, 861, 900
See application file for complete search history.

(56) References Cited

U.S. PATENT DOCUMENTS

| | | | | |
|---|---|---|---|---|
| 9,268,122 | B2* | 2/2016 | Zhu | G01J 1/0414 |
| 9,268,123 | B2* | 2/2016 | Zhu | G02B 17/0642 |
| 9,405,109 | B2* | 8/2016 | Yang | G02B 17/0642 |
| 9,524,565 | B2* | 12/2016 | Zhu | G02B 27/0012 |
| 9,703,084 | B2* | 7/2017 | Zhu | G02B 17/0642 |
| 9,818,223 | B2* | 11/2017 | Zhu | G06F 17/10 |
| 9,846,298 | B2* | 12/2017 | Zhu | G02B 17/0642 |
| 9,996,635 | B2* | 6/2018 | Zhu | G06F 17/50 |
| 10,101,204 | B2* | 10/2018 | Zhu | G01J 3/0289 |
| 2015/0254375 | A1* | 9/2015 | Yang | G06F 17/12 |
| | | | | 703/1 |
| 2016/0232257 | A1* | 8/2016 | Zhu | G02B 27/0012 |
| 2016/0232718 | A1* | 8/2016 | Zhu | G06T 19/20 |

OTHER PUBLICATIONS

Ding Yi, Design of Freeform Optical Devices and Their Applications in Illumination Systems, Chinese Doctoral Dissertations Full-text Database Engineering Science and Technology II, Dec. 15, 2010, 22-44, issue12, China.

* cited by examiner

METHOD FOR DESIGING OFF-AXIAL THREE-MIRROR OPTICAL SYSTEM WITH FREEFORM SURFACES

CROSS-REFERENCE TO RELATED APPLICATIONS

This application claims all benefits accruing under 35 U.S.C. § 119 from China Patent Application No. 201410077992.8, field on Mar. 5, 2014 in the China Intellectual Property Office, disclosure of which is incorporated herein by reference. The application is also related to co-pending applications entitled, "OFF-AXIAL THREE-MIRROR OPTICAL SYSTEM WITH FREEFORM SURFACES", filed Dec. 16, 2014 Ser. No. 14/571,965; "OFF-AXIAL THREE-MIRROR OPTICAL SYSTEM WITH FREEFORM SURFACES", filed Dec. 16, 2014 Ser. No. 14/571,952; "METHOD FOR DESIGNING FREEFORM SURFACE", filed Feb. 5, 2015 Ser. No. 14/616,457.

BACKGROUND

1. Technical Field

The present disclosure relates to a method for designing optical systems, especially a method for designing off-axial three-mirror optical system with freeform surfaces.

2. Description of Related Art

Compared with conventional rotationally symmetric surfaces, freeform surfaces have higher degrees of freedom, which can reduce the aberrations and simplify the structure of the system in optical design. In recent years, with the development of the advancing manufacture technologies, freeform surfaces have been successfully used in the optical field, such as head-mounted-displays, reflective systems, varifocal panoramic optical systems, and micro-lens arrays.

However, conventional designing methods mostly focus on designing optical systems with small aperture and linear field-of-view systems.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series, and the like. It should be noted that references to "one" embodiment in this disclosure are not necessarily to the same embodiment, and such references mean at least one.

Figure 1:
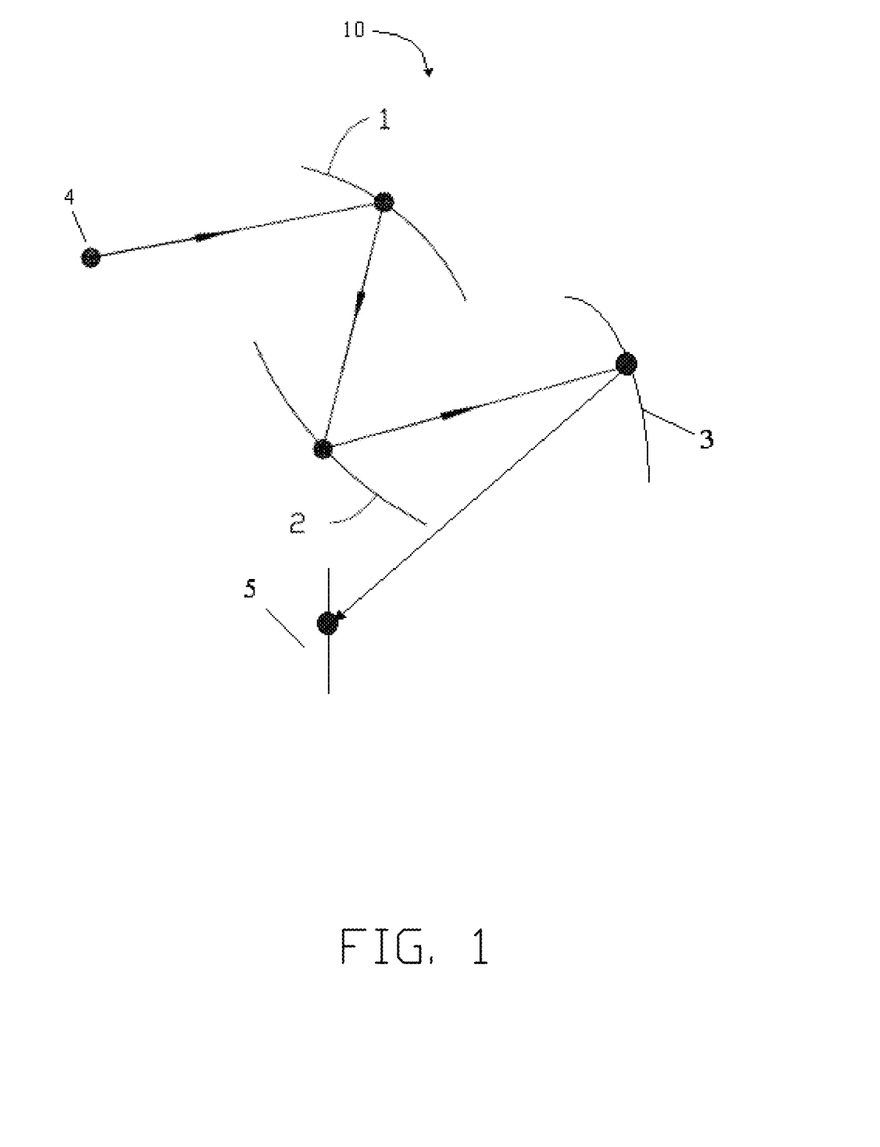
FIG. 1 is a schematic view of one embodiment of an off-axial three-mirror optical system with freeform surfaces.

Referring to FIG. 1, an off-axial three-mirror optical system with freeform surfaces 10 of one embodiment is provided. The off-axial three-mirror optical system with freeform surfaces 10 includes a first freeform surface 1, a second freeform surface 2 and a third freeform surface 3, which are separated from each other. The second freeform surface 2 is a stop surface. Lights coming from the object space are successively reflected by the first freeform surface 1, the second freeform surface 2 and the third freeform surface 3; and then form an image on an image plane 5.

Figure 2:
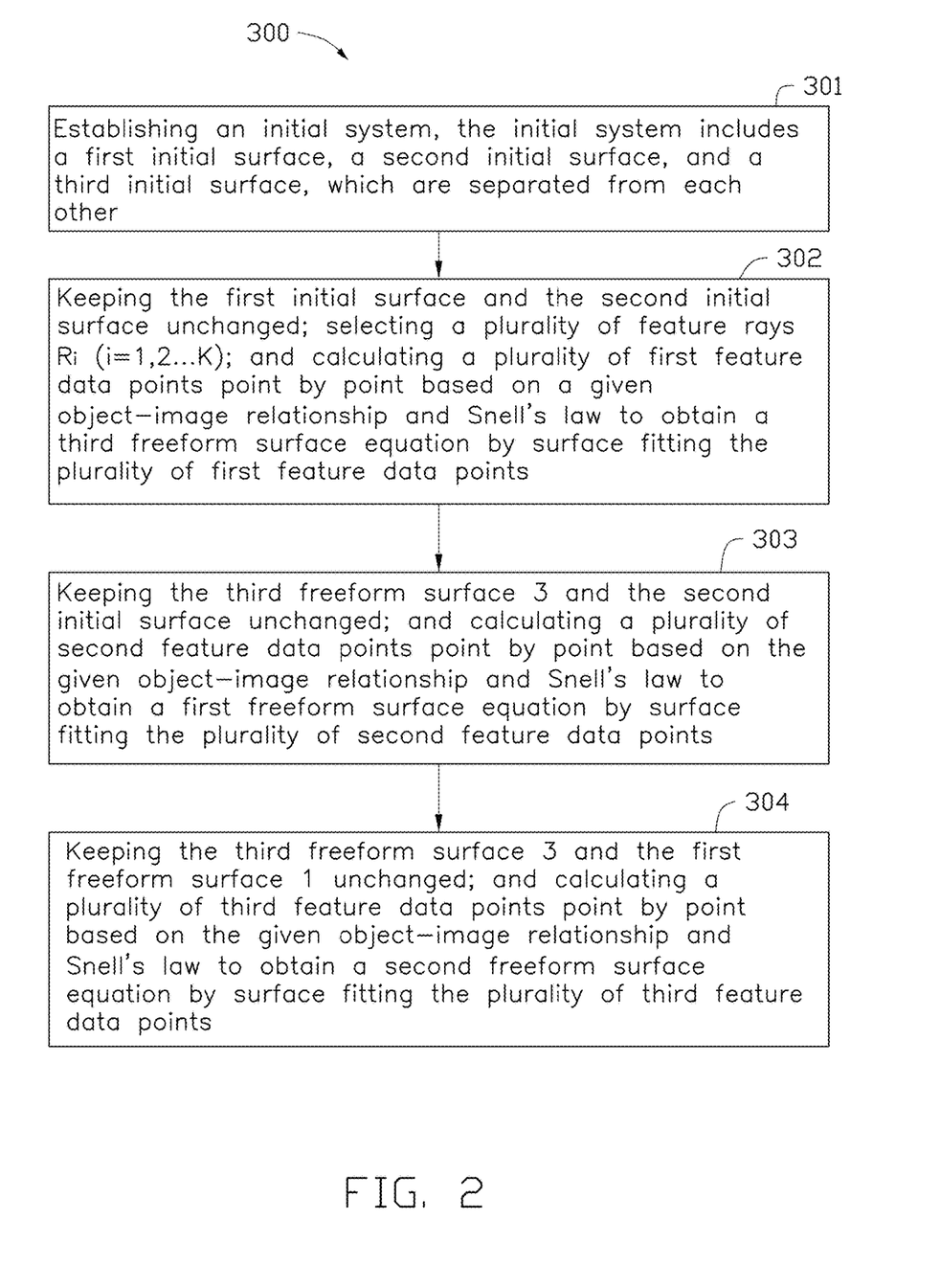
FIG. 2 shows a flow chart of a method for designing off-axial three-mirror optical system with freeform surfaces according to one embodiment.

Referring to FIG. 2, an embodiment of a method for designing the off-axial three-mirror optical system with freeform surfaces includes the following steps:

step (S1), establishing an initial system, the initial system includes a first initial surface, a second initial surface, and a third initial surface, which are separated from each other;

step (Ω), keeping the first initial surface and the second initial surface unchanged; selecting a plurality of feature rays $R_i$ (i=1, 2 . . . K); and calculating a plurality of first feature data points point by point based on a given object-image relationship and Snell's law to obtain a third freeform surface equation by surface fitting the plurality of first feature data points;

step (S3), keeping the third freeform surface 3 and the second initial surface unchanged; and calculating a plurality of second feature data points point by point based on the given object-image relationship and Snell's law to obtain a first freeform surface equation by surface fitting the plurality of second feature data points; and step (S4), keeping the third freeform surface 3 and the first freeform surface 1 unchanged; and calculating a plurality of third feature data points point by point based on the given object-image relationship and Snell's law to obtain a second freeform surface equation by surface fitting the plurality of third feature data points.

In step (S1), the first initial surface, the second initial surface and the third initial surface can be planar, spherical, or other surface type. A first initial surface location, a second initial surface location and a third initial surface location can be selected according to the optical systems actual needs. In one embodiment, each of the first initial surface, the second initial surface and the third initial surface is a planar.

In step (Ω), a plurality of intersections of the plurality of feature rays $R_i$ (i=1, 2 ... K) and the image surface are close to a plurality of ideal image points $I_i$ (i=1, 2 ... K). The selecting a plurality of feature rays $R_i$ (i=1, 2 ... K) comprises includes steps of: M fields are selected according to the optical systems actual needs; an aperture of each of the M fields is divided into N equal parts; and, P feature rays at different aperture positions in each of the N equal parts are selected. As such, K=M×N×P different feature rays correspond to different aperture positions and different fields are fixed. The aperture can be circle, rectangle, square, oval or other shapes.

Figure 3:
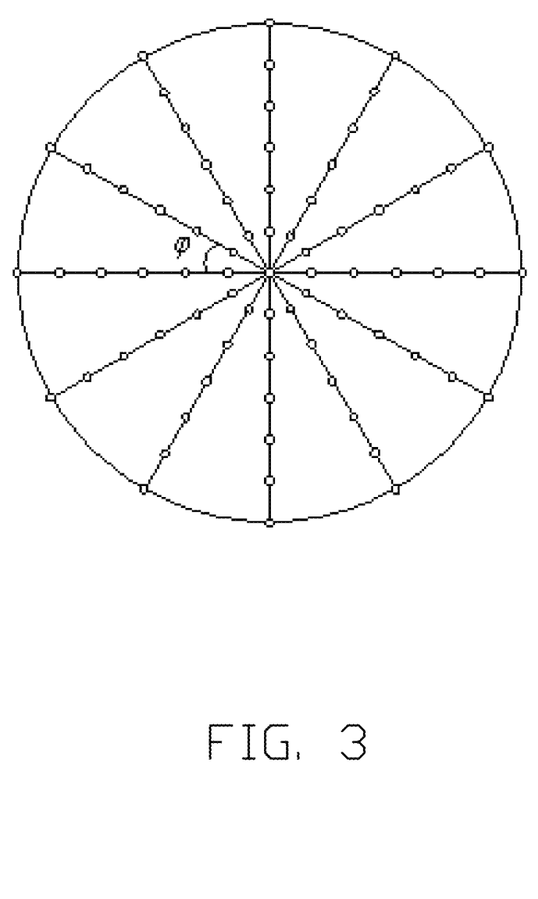
FIG. 3 is a schematic view of a selecting method of a plurality of feature rays employed in each field according to one embodiment.

Referring to FIG. 3, in one embodiment, the aperture of each of the M fields is a circle, and a circular aperture of each of the M fields is divided into N angles with equal interval $\varphi$, as such, N=2π/φ; then, P different aperture positions are fixed along a radial direction of each of the N angles. Therefore, K=M×N×P different feature rays correspond to different aperture positions and different fields are fixed. In one embodiment, six fields are fixed in the construction process; a circular aperture of each of the six fields is divided into fourteen angles with equal intervals; and seven different aperture positions are fixed along the radial direction of each of the fourteen angles. Therefore, 588 different feature rays correspond to different aperture positions and different fields are fixed.

Figure 4:
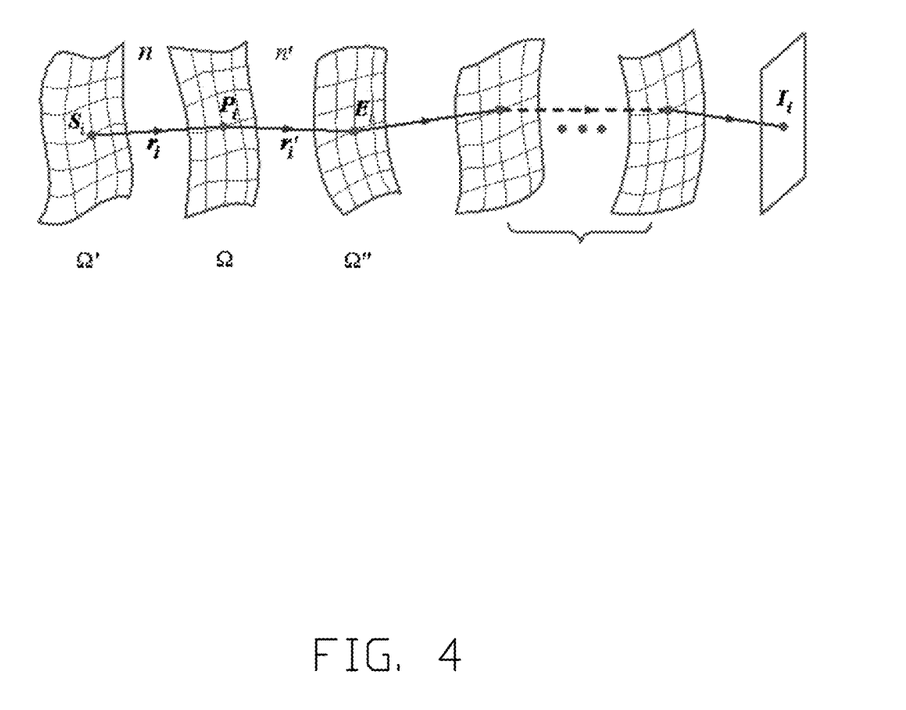
FIG. 4 is a schematic view of start point and end point of one feature ray while solving the feature data points according to one embodiment.

Referring to FIG. 4, a surface Ω is defined as the unknown freeform surface, a surface Ω' is defined as a surface located adjacent to and before the surface Ω, and a surface Ω" is defined as a surface located adjacent to and behind the surface Ω. Defining the intersections of the plurality of feature rays $R_i$ (i=1, 2 ... K) with the surface Ω as the feature data points $P_i$ (i=1, 2 ... K). The feature data points $P_i$ (i=1, 2 ... K) can be obtained by the intersections of the feature rays $R_i$ (i=1, 2 ... K) with the surface ST and the surface Ω". The plurality of feature rays $R_i$ (i=1, 2 ... K) are intersected with the surface Ω' at a plurality of start points $S_i$ (i=1, 2 ... K), and intersected with the surface Ω" at a plurality of end points $E_i$ (i=1, 2 ... K). When the surface Ω and the plurality of feature rays $R_i$ (i=1, 2 ... K) are determined, the plurality of start points $S_i$ (i=1, 2 ... K) of the feature rays $R_i$ (i=1, 2 ... K) can also be determined. The plurality of end points $E_i$ (i=1, 2 ... K) can be obtained based on the object-image relationship. Under ideal conditions, the feature rays $R_i$ (i=1, 2 ... K) emitted from the plurality of start points $S_i$ (i=1, 2 ... K) on the surface ST; pass through the feature data points $P_i$ (i=1, 2 ... K) on the surface Ω; intersect with the surface Ω" at the plurality of end points $E_i$ (i=1, 2 ... K); and finally intersect with the image plane at the plurality of ideal image points $I_i$ (i=1, 2 ... K). If the surface Ω" is the image plane, the plurality of end points $E_i$ (i=1, 2 ... K) are the plurality of ideal image points $I_i$ (i=1, 2 ... K). If there are other surfaces between the surface Ω and the image plane, the plurality of end points $E_i$ (i=1, 2 ... K) are the points on the surface Ω" which minimizes an optical path length between the plurality of feature data points $P_i$ (i=1, 2 ... K) and the plurality of ideal image points $I_i$ (i=1, 2 ... K).

The plurality of first feature data points $P_i$ (i=1, 2 ... K) can be obtained by the following two calculating methods.

A first calculating method includes the following sub-steps:

Step (a): defining a first intersection of a first feature ray $R_1$ and the third initial surface as a first feature data point $P_1$;

Step (b): when i (1≤i≤K−1) first feature data points $P_i$ (1≤i≤K−1) have been obtained, a unit normal vector $\vec{N}_i$ (1≤i≤K−1) at each of the i (1≤i≤K−1) first feature data points $P_i$ (1≤i≤K−1) can be calculated based on a vector form of Snell's Law;

Step (c): making a first tangent plane at the i (1≤i≤K−1) first feature data points $P_i$ (1≤i≤K−1) respectively; thus i first tangent planes can be obtained, and i×(K−i) second intersections can be obtained by the i first tangent planes intersecting with remaining (K−i) feature rays; and a second intersection, which is nearest to the i (1≤i≤K−1) first feature data points $P_i$, is fixed from the i×(K−i) second intersections as a next first feature data point $P_{i+1}$ (1≤i≤K−1); and Step (d): repeating steps b and c, until all the plurality of first feature data points $P_i$ (i=1, 2 ... K) are calculated.

In step (b), the unit normal vector $\vec{N}_i$ (1≤i≤K−1) at each of the feature data point $P_i$ (1≤i≤K−1) can be calculated based on the vector form of Snell's Law. When the unknown freeform surface is a refractive second surface, $$\vec{N}_i = \frac{n'\vec{r}_i' - n\vec{r}_i}{|n'\vec{r}_i' - n\vec{r}_i|} \quad (1)$$

$$\vec{r}_i = \frac{\overrightarrow{P_i S_i}}{|\overrightarrow{P_i S_i}|}$$

is a unit vector along a direction of an incident ray of the unknown freeform surface;

$$\vec{r}_i' = \frac{\overrightarrow{E_i P_i}}{|\overrightarrow{E_i P_i}|}$$

is a unit vector along a direction of an exit ray of the unknown freeform surface; and n, n' is refractive index of a media at two opposite sides of the unknown freeform surface respectively.

Similarly, when the unknown freeform surface is a reflective surface, $$\vec{N}_i = \frac{\vec{r}_i' - \vec{r}_i}{|\vec{r}_i' - \vec{r}_i|} \quad (2)$$

The unit normal vector $\vec{N}_i$ at the feature data points $P_i$ (i=1, 2 ... K) is perpendicular to the first tangent plane at the feature data points $P_i$ (i=1, 2 ... K). Thus, the first tangent planes at the feature data points $P_i$ (i=1, 2 ... K) can be obtained.

The first calculating method includes a computational complexity formula of $$T(K) = \sum_{i=1}^{K-1} i(K-i) = \frac{1}{6}K^3 - \frac{1}{6}K = O(K^3).$$

When multi-feature rays are used in a design, the first calculating method requires a long computation time.

A second calculating method includes the following substeps:

Step (a'): defining a first intersection of a first feature ray $R_1$ and the initial surface as a first feature data point $P_1$;

Step (b'): when an ith (1≤i≤K−1) first feature data point $P_i$ (1≤i≤K−1) has been obtained, a unit normal vector $\vec{N}_i$ at the ith (1≤i≤K−1) first feature data point $P_i$ (1≤i≤K−1) can be calculated based on the vector form of Snell's Law;

Step (c'): making a first tangent plane through the ith (1≤i≤K−1) first feature data point $P_i$ (1≤i≤K−1); and (K−i) second intersections can be obtained by the first tangent plane intersects with remaining (K−i) feature rays; a second intersection $Q_{i+i}$, which is nearest to the ith (1≤i≤K−1) first feature data point $P_i$ (1≤i≤K−1), is fixed; and a feature ray corresponding to the second intersection $Q_{i+1}$ is defined as $R_{i+1}$ a shortest distance between the second intersection $Q_{i+1}$ and the ith (1≤i≤K−1) first feature data point $P_i$ (1≤i≤K−1) is defined as $d_i$;

Step (d'): making a second tangent plane at (i−1) first feature data points that are obtained before the ith first feature data point $P_i$ (1≤i≤K−1) respectively; thus, (i−1) second tangent planes can be obtained, and (i−1) third intersections can be obtained by the (i−1) second tangent planes intersecting with a feature ray $R_{i+1}$; in each of the (i−1) second tangent planes, each of the third intersections and its corresponding feature data point form an intersection pair; the intersection pair, which has the shortest distance between a third intersection and its corresponding feature data point, is fixed; and the third intersection and the shortest distance is defined as $Q'_{i+1}$ and $d'_i$ respectively;

Step (e'): comparing $d_i$ and $d'_i$, if $d_i \le d'_i$, $Q_{i+1}$ is taken as the next first feature data point $P_{i+1}$ (1≤i≤K−1); otherwise, $Q'_{i+1}$ is taken as the next first feature data point $P_{i+1}$ (1≤i≤K−1); and Step (f'): repeating steps from b' to e', until the plurality of first feature data points $P_i$ (i=1, 2 ... K) are all calculated.

In Step (b'), a calculating method of the unit normal vector $\vec{N}_i$ at the ith (1≤i≤K−1) first feature data point $P_i$ (1≤i≤K−1) is same as the first calculation method.

A second calculating method includes a computational complexity formula of $$T(K) = \sum_{i=1}^{K-1} K - i + i - 1 = (K-1)^2 = O(K^2).$$

When multi-feature rays are used in a design, the computational complexity of the second calculating method is smaller than the computational complexity of the first calculating method. In one embodiment, constructing the plurality of first feature data points $P_i$ (i=1, 2 ... K) point by point using the second calculating method.

In step (S3), the surface Ω is the first freeform surface 1, the surface Ω" is the second freeform surface 2. The plurality of end points $E_i$ (i=1, 2 ... K) are the points on the surface Ω" which minimizes the optical path length between the feature data points $P_i$ (i=1, 2 ... K) and the ideal image points $I_i$ (i=1, 2 ... K). Other characteristics of step (S3) are the same as step (Ω).

In step (S4), the surface Ω is the second freeform surface 2, the surface Ω" is the third freeform surface 3. The plurality of end points $E_i$ (i=1, 2 ... K) are the points on the surface Ω" which minimizes the optical path length between the feature data points $P_i$ (i=1, 2 ... K) and the ideal image points $I_i$ (i=1, 2 ... K). Other characteristics of step (S4) are the same as step (Ω).

The off-axial three-mirror optical system with freeform surfaces 10 obtained in one embodiment can be the initial system for further optimization. An order of steps (S1) to (S4) can be changed according to the actual needs.

An off-axial three-mirror optical system with freeform surfaces was designed with the above method to prove the above method. The parameters of the off-axial three-mirror optical system with freeform surfaces are given in Table 1.

TABLE 1

Parameters of the off-axial three-mirror
optical system with freeform surfaces:

| Parameters | values |
|---|---|
| FOV | 8° × 9° |
| Structure | off-axial three-mirror |
| Wavelength | LWIR(8-12 μm) |
| entrance pupil diameter | 64 mm |
| F# | 1.48 |
| relative aperture(D/f) | 0.676 |
| focal length (f) | 94.71 mm |

Figure 5:
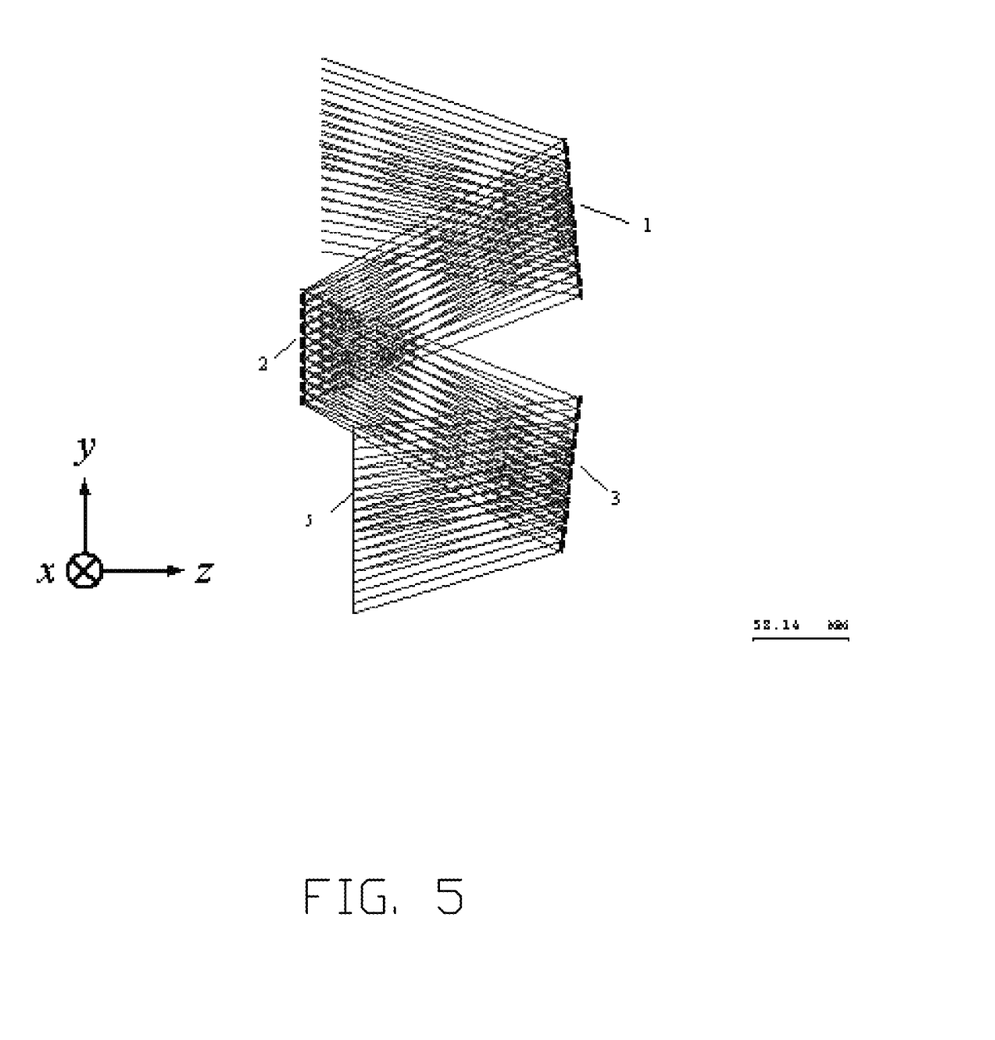
FIG. 5 shows a schematic view of an initial system of the off-axial three-mirror optical system with freeform surfaces in FIG. 1.

Referring to FIG. 5, the initial system was set up with three planes. It can be seen that lights of each field cannot focus on the image plane 5, and intersections of the lights of each field and the image plane 5 deviate from the ideal image points.

Figure 6:
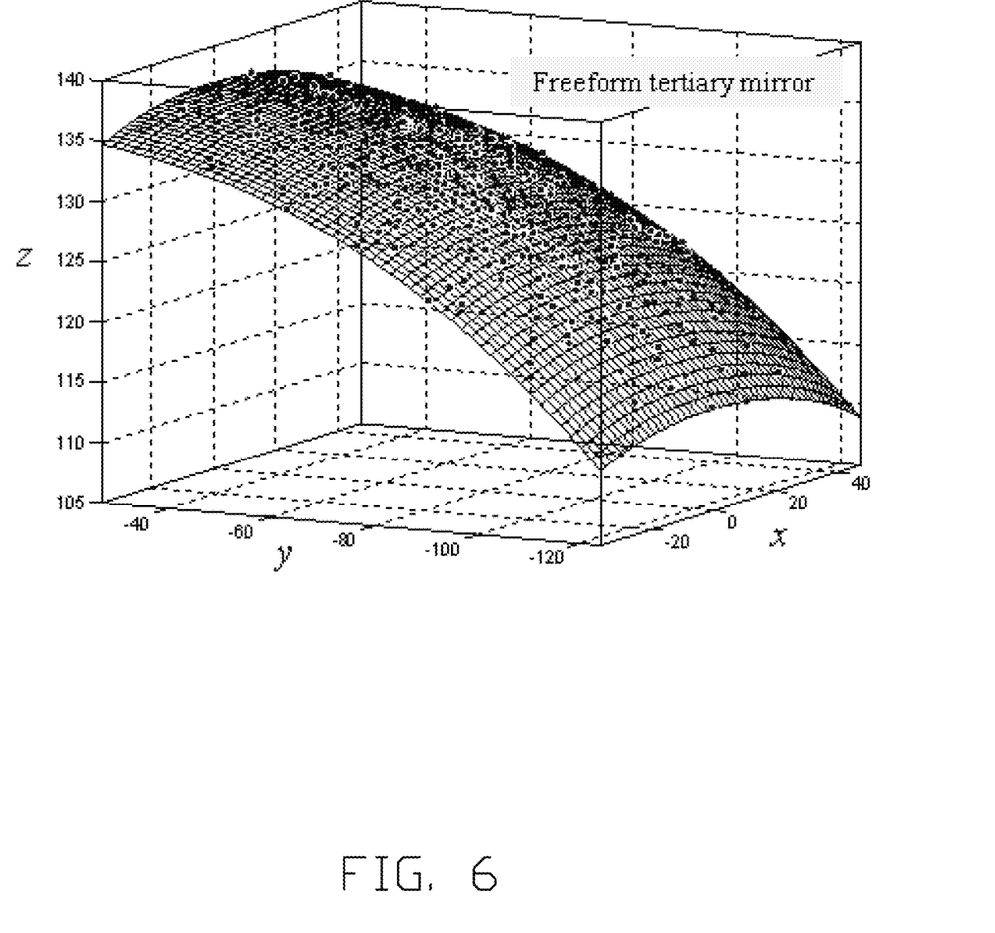
FIG. 6 shows a schematic view of one embodiment of a third freeform surface.
Figure 7:
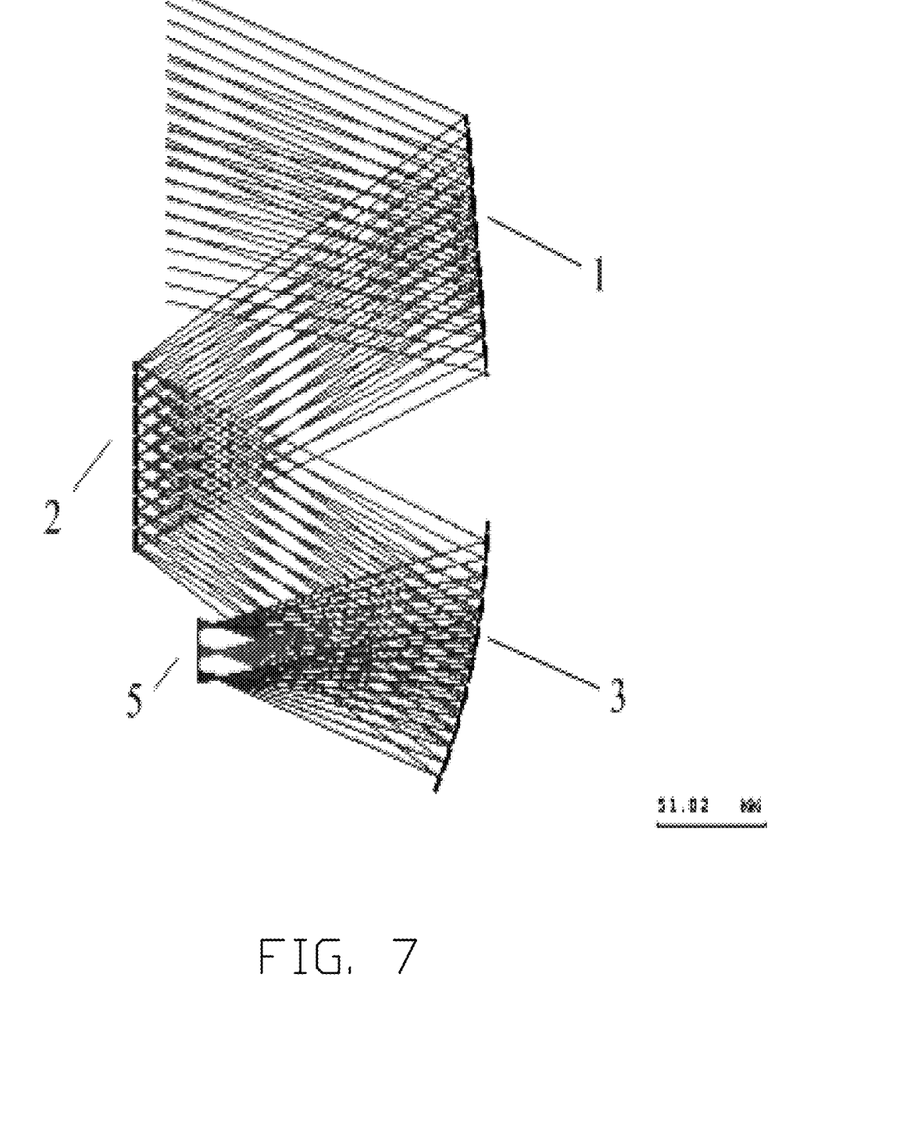
FIG. 7 shows a schematic view of an off-axial three-mirror optical system with the third freeform surface in FIG. 6.

Referring to FIG. 6 and FIG. 7, the third initial surface of the initial system is replaced by the third freeform surface 3 obtained by the above second calculating method. It can be seen that the lights of each field can focus to the ideal image points approximately, which illustrates that the freeform surface, obtained by the designing method, can improve the imaging quality of optical system.

Figure 8:
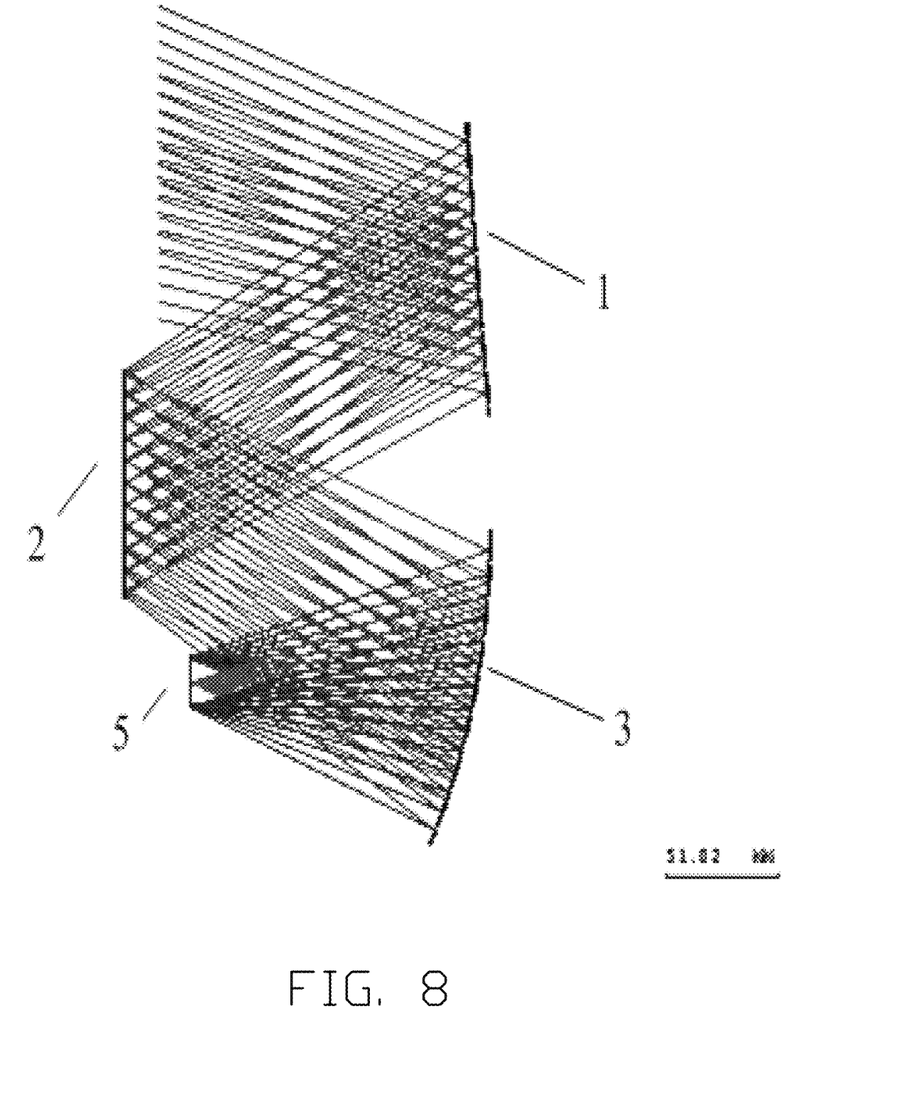
FIG. 8 shows a schematic view of an off-axial three-mirror optical system with three freeform surfaces according to one embodiment.

Referring to FIG. 8, the first initial surface, the second initial surface and the third initial surface of the initial system are respectively replaced by the first freeform surface 1, the second freeform surface 2, and the third freeform surface 3. It can be seen that the lights of each field can focus to the ideal image points approximately. The image quality can be greatly improved compared to the initial system.

Figure 9:
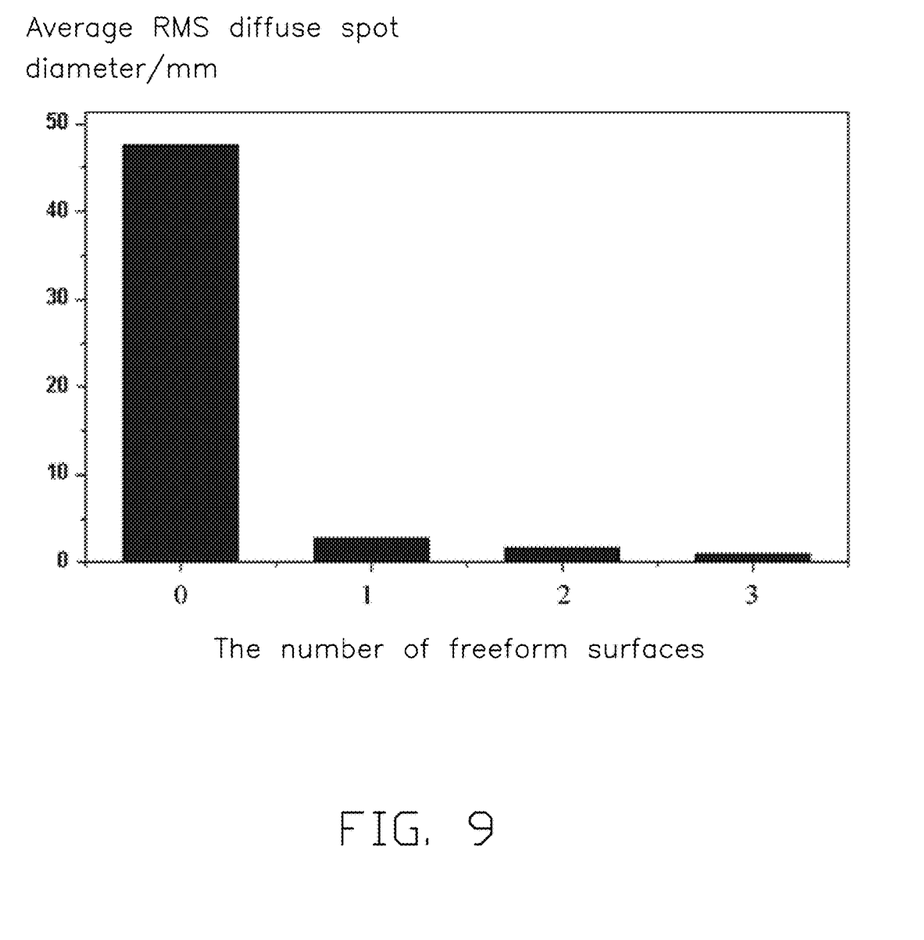
FIG. 9 shows a comparison chart of average RMS spot diameter of off-axial three-mirror optical systems with different number of freeform surfaces.

FIG. 9 is a comparison chart of average RMS spot diameter of off-axial three-mirror optical systems without freeform surface, off-axial three-mirror optical systems with one freeform surface, off-axial three-mirror optical systems with two freeform surfaces, and off-axial three-mirror optical systems with three freeform surfaces. It can be seen that with the increase of the number of freeform surfaces, the average root mean squared (RMS) spot diameter of the off-axial three-mirror optical systems is reduced. The average RMS spot diameter of the off-axial three-mirror optical systems with three freeform surfaces is the smallest, which illustrates that the image quality of the off-axial three-mirror optical systems with three freeform surfaces is the best.

The method for designing the off-axial three-mirror optical systems with freeform surfaces can have many advantages.

Given the object-image relationships and the initial system with planar, spherical, or other surface type, each freeform surface of the off-axial three-mirror optical system with freeform surfaces can be generated by a point by point constructing method. Thus, the method for designing off-axial three-mirror optical system with freeform surfaces is simple and can be applied to various off-axis asymmetric systems.

The method can be applied in imaging systems with multi-fields and certain aperture, by controlling the feature rays of the multi-fields and different aperture positions, and the number of fields is not limited, thus, the designing method has broad applications.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for designing an off-axial three-mirror optical system with freeform surfaces comprising:
   step (S1), establishing an initial system, the initial system comprises a first initial surface, a second initial surface, and a third initial surface; wherein the first initial surface, the second initial surface, and the third initial surface are separated from each other;
   step (S2), keeping the first initial surface and the second initial surface unchanged; selecting a plurality of feature rays; and calculating a plurality of first feature data points point by point based on a object-image relationship and Snell's law to obtain a third freeform surface by surface fitting the plurality of first feature data points;
   step (S3), keeping the third freeform surface and the second initial surface unchanged; and calculating a plurality of second feature data points point by point based on the object-image relationship and Snell's law to obtain a first freeform surface by surface fitting the plurality of second feature data points; and
   step (S4), keeping the third freeform surface and the first freeform surface unchanged; and calculating a plurality of third feature data points point by point based on the object-image relationship and Snell's law to obtain a second freeform surface by surface fitting the plurality of third feature data points.

2. The method of claim 1, wherein the first initial surface, the second initial surface, or the third initial surface is planar or spherical.

3. The method of claim 1, wherein the selecting the plurality of feature rays comprises steps of: selecting M fields; dividing an aperture of each of the M fields into N equal parts; and, P feature rays at different positions in each of the N equal parts are selected, thus, K=M×N×P different feature rays are selected.

4. The method of claim 3, wherein the aperture of each of the M fields is circle.

5. The method of claim 4, wherein the aperture of each of the M fields is divided into N angles with equal intervals.

6. The method of claim 5, wherein P different positions are selected along a radial direction of each of the N angles.

7. The method of claim 1, wherein $\Omega$ is defined as an unknown freeform surface, $\Omega'$ is defined as a first surface located before $\Omega$, and $\Omega''$ is defined as a second surface located behind $\Omega$; and the plurality of feature rays intersect $\Omega'$ at a plurality of start points, and intersect $\Omega''$ at a plurality of end points.

8. The method of claim 7, wherein the plurality of end points are obtained by the object-image relationship.

9. The method of claim 8, wherein $\Omega$ is the third freeform surface, and the plurality of end points are a plurality of ideal image points.

10. The method of claim 9, wherein the number of the plurality of first feature data points is i, the number of the plurality of feature rays is K, a calculating method of the plurality of first feature data points comprises:
    Step (a): defining a first intersection of a feature ray $R_1$ and an initial surface as a first feature data point $P_1$;
    Step (b): when j first feature data points have been obtained, wherein a value of j is less than a value of i, a unit normal vector $\vec{N}_j$ at each of the j first feature data points is calculated based on a vector form of Snell's Law;
    Step (c): making a first tangent plane at the j first feature data points respectively; thus j first tangent planes are obtained, and j multiplied by K−j second intersections are obtained by the j first tangent planes intersecting with remaining K−j feature rays; and a second intersection, which is nearest to the j first feature data points, is fixed from the j multiplied by K−j second intersections as a next feature data point; and
    Step (d): repeating steps b and c, until all i first feature data points are calculated.

11. The method of claim 10, wherein the calculating method comprises a computational complexity of $$T(K) = \sum_{i=1}^{K-1} i(K-i) = \frac{1}{6}K^3 - \frac{1}{6}K = O(K^3),$$

O denotes a time complexity of the calculating method, and $O(K^3)$ refers that the total calculation steps are to a third order of K.

12. The method of claim 8, wherein $\Omega$ is the first freeform surface, and the plurality of end points are a plurality of points on $\Omega''$ which minimizes an optical path length between the plurality of second feature data points and a plurality of ideal image points.

13. The method of claim 8, wherein $\Omega$ is the second freeform surface, and the plurality of end points are a plurality of points on $\Omega''$ which minimizes an optical path length between the plurality of third feature data points and a plurality of ideal image points.

* * * * *